(12) United States Patent
Kuznetsov et al.

(10) Patent No.: US 7,048,488 B1
(45) Date of Patent: May 23, 2006

(54) APPARATUS FOR TRANSFERRING WAFER AND RING

(75) Inventors: Vladimir Ivanovich Kuznetsov, Delft (NL); Theodorus Gerardus Maria Oosterlaken, Oudewater (NL); Christianus Gerardus Maria Ridder, Hoogland (NL); Ernst Hendrik August Granneman, Hilversum (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/009,851

(22) PCT Filed: May 8, 2000

(86) PCT No.: PCT/NL00/00297

§ 371 (c)(1),
(2), (4) Date: Nov. 6, 2001

(87) PCT Pub. No.: WO00/68977

PCT Pub. Date: Nov. 16, 2000

(30) Foreign Application Priority Data

May 7, 1999 (NL) .................................... 1012004

(51) Int. Cl.
*B65G 25/00* (2006.01)
(52) U.S. Cl. .................. 414/152; 118/725; 392/418
(58) Field of Classification Search ........... 414/150, 414/152; 392/416, 418; 118/725
See application file for complete search history.

(56) References Cited

U.S. PATENT DOCUMENTS

| 3,947,236 | A |   | 3/1976  | Lasch, Jr. |
| 4,468,259 | A |   | 8/1984  | Mimura |
| 4,495,024 | A |   | 1/1985  | Bok |
| 4,575,408 | A |   | 3/1986  | Bok |
| 4,738,748 | A |   | 4/1988  | Kisa |
| 4,860,687 | A |   | 8/1989  | Frijlink ........................ 118/500 |
| 5,162,047 | A |   | 11/1992 | Wada et al. |
| 5,592,581 | A | * | 1/1997  | Okase ........................ 392/418 |
| 5,711,811 | A |   | 1/1998  | Suntola et al. |
| 5,788,425 | A |   | 8/1998  | Skow et al. |
| 5,820,367 | A |   | 10/1998 | Osawa |
| 5,879,459 | A |   | 3/1999  | Gadgil et al. |
| 5,897,311 | A |   | 4/1999  | Nishi |
| 5,983,906 | A | * | 11/1999 | Zhao et al. ................... 134/1.1 |
| 6,100,505 | A | * | 8/2000  | Pike ......................... 219/444.1 |
| 6,111,225 | A |   | 8/2000  | Ohkase et al. .............. 219/390 |
| 6,167,834 | B1 | * | 1/2001 | Wang et al. ............. 118/723 E |
| 6,168,668 | B1 | * | 1/2001 | Yudovsky ................... 118/715 |

(Continued)

FOREIGN PATENT DOCUMENTS

EP          0 405 301          1/1991

(Continued)

*Primary Examiner*—Joe Dillon, Jr.
(74) *Attorney, Agent, or Firm*—Knobbe, Martens, Olson & Bear, LLP (57) ABSTRACT

For wafer processing, wafers are transferred between a thermal treatment chamber and a thermal treatment installation. The treatment chamber has a top section and a bottom section between which the wafer is accommodated during treatment. The thermal treatment installation has a loading chamber having loading means and transport means. The wafer is place on a wafer support while in the loading chamber, wherein the wafer support is configured as a ring having support elements to support the wafer. The wafer support loaded with the wafer is inserted into the thermal treatment chamber so that the wafer and the wafer support are positioned between the top section and the bottom section. The wafer is individually processed in the thermal treatment chamber. After processing the wafer, the wafer support is removed from the thermal treatment chamber.

9 Claims, 6 Drawing Sheets

U.S. PATENT DOCUMENTS

| | | | |
|---|---|---|---|
| 6,228,171 B1 * | 5/2001 | Shirakawa | 118/666 |
| 6,280,183 B1 * | 8/2001 | Mayur et al. | 432/258 |
| 6,325,858 B1 * | 12/2001 | Wengert et al. | 118/725 |
| 6,329,304 B1 * | 12/2001 | Kuznetsov et al. | 438/799 |
| 6,344,632 B1 * | 2/2002 | Yu et al. | 219/444.1 |
| 6,347,919 B1 * | 2/2002 | Ryan et al. | 412/217 |
| 6,355,909 B1 * | 3/2002 | Griffiths et al. | 219/403 |
| 6,399,922 B1 * | 6/2002 | Okase et al. | 219/405 |
| 6,462,411 B1 * | 10/2002 | Watanabe et al. | 257/723 |
| 6,551,404 B1 * | 4/2003 | Snijders et al. | 118/725 |
| 6,554,906 B1 * | 4/2003 | Kuibira et al. | 118/725 |
| 6,559,039 B1 * | 5/2003 | Wang et al. | 438/542 |
| 6,561,798 B1 * | 5/2003 | Kuznetsov et al. | 432/249 |
| 6,719,499 B1 * | 4/2004 | Kuznetsov et al. | 406/90 |
| 6,753,508 B1 * | 6/2004 | Shirakawa | 219/444.1 |
| 6,776,849 B1 * | 8/2004 | Aggarwal et al. | 118/728 |
| 6,805,749 B1 * | 10/2004 | Granneman et al. | 118/725 |
| 6,824,619 B1 * | 11/2004 | Kuznetsov et al. | 118/730 |

FOREIGN PATENT DOCUMENTS

| | | |
|---|---|---|
| EP | 0 821 403 | 1/1998 |
| GB | 2 199 022 | 6/1988 |
| JP | JP 63-136532 | 8/1968 |
| JP | 63-136532 | * 11/1986 |
| WO | WO 98/01890 | 1/1998 |

* cited by examiner

APPARATUS FOR TRANSFERRING WAFER AND RING

FIELD OF THE INVENTION

The present invention relates to a method of transferring a wafer between a thermal treatment chamber and a thermal treatment installation.

BACKGROUND OF THE INVENTION

U.S. Pat. No. 5,162,047 discloses a thermal treatment installation which comprises a thermal treatment chamber, a "wafer boat"/rings assembly, a loading device and a transport device. With this arrangement the loading device serves to place wafers in and to remove wafers from the assembly and the transport device serves to place the assembly in and remove the assembly from the thermal treatment chamber.

The assembly consists of a frame to which a large number of rings are joined equally spaced, with their flat sides positioned above one another. The rings are each provided with a recess, which is not specified in more detail, in the inner edge, on which a wafer can be placed by the loading device.

After loading a large number of wafers, the assembly is moved by the transport device to the thermal treatment chamber to subject all wafers, located on the recesses, simultaneously to a treatment in which a heat treatment takes place.

In installations as disclosed in U.S. Pat. No. 5,162,047 the wafers remain in contact with the rings during the entire heat treatment.

During heat treatment of a substrate, for example a silicon wafer, plastic deformation of the wafer can occur. In the case of silicon at temperatures higher than 900–1000° C. the mechanical strength of the wafer decreases substantially and plastic deformation can occur more easily than at room temperature. The deformation of silicon wafers occurs because crystal planes can shift over one another under the influence of stresses present or generated in the material. This is known by the term "slip". This slip can lead to warping of the wafer such that this is detectable with the naked eye.

Two sources of stress which give rise to slip will be present in the material. Firstly, the force of gravity, which in the case of horizontally positioned wafers is exerted uniformly over the entire surface thereof, in combination with the wafer support, which in general takes place at only a few points. This leads to local mechanical stresses, in particular on and close to the support points, which are also termed gravitational stresses.

Secondly, there is a temperature gradient over the wafer which leads to a non-uniform expansion of the wafer with corresponding mechanical stresses, also referred to as thermal stresses. This temperature gradient over the wafer occurs in particular on introducing it into a reactor and removing it therefrom. In general the temperature in the reactor will be appreciable, for example 900–1000° C., in order to achieve an adequate throughput time. If the ambient temperature is room temperature, on introduction of the wafer into or removal of the wafer from the reactor a substantial temperature gradient will be produced, with the resultant stresses. After all, the thermal capacity is relatively low because of the limited thickness and the large radiating surface of the wafer.

In installations as disclosed in U.S. Pat. No. 5,162,047 the wafers are thus also subjected to a temperature difference during heating and cooling at those locations where there is contact with the ring, since the ring has a certain thermal capacity. So as not to allow temperature differences during loading into and unloading from the thermal treatment installation to become so large that mechanical stresses in the wafer lead to plastic deformation, transport of the combination into and out of the thermal treatment chamber must always take place at a suitable speed.

Moreover, the connection between the rings and the frame gives rise to an additional difference in thermal capacity in the rings which, as a result of the positioning of the connection, can lead to local deviation of the temperature in the ring and the wafer, as a result of which mechanical stresses can also be produced locally in the wafer during heating/cooling. Local adverse deformation of the wafer can occur as a result.

In some installations treatment is not carried out on a large number of wafers at the same time, as in U.S. Pat. No. 5,162,047, but, for reasons specific to the treatment process, only one wafer is treated at a time. For such thermal treatment installations in which only a single wafer is treated per thermal treatment it is customary according to the prior art to place the wafer in, or remove the wafer from, the thermal treatment chamber individually, that is to say directly with the aid of a transport mechanism and without an auxiliary support such as, for example, a wafer ring.

SUMMARY OF THE INVENTION

The present invention relates in particular to contact-free treatment of a wafer. For this treatment the wafer in a reactor is supported uniformly over the entire surface by a gas stream, so that no gravitational stresses can arise during the treatment. The top section and bottom section of the reactor, between which the wafer is accommodated, can be heated very uniformly so that no temperature gradient of any significance is produced over the wafer during the treatment. However, it has been found that during loading or unloading of the wafer the abovementioned stresses can still occur, as a result of which slip takes place. After all, according to the prior art the wafer is picked up by a cold gripper for introduction and removal, high local temperature gradients are produced close to the support points and slip occurs. Likewise, an appreciable temperature gradient is produced over the wafer as a whole. This gradient has two components: a linear and a radial component. The linear component arises because the wafer is withdrawn from between the two hot reactor bodies (top section and bottom section) in a linear movement. The radial component arises because the edge of the wafer is able to radiate its heat over a wider angle than the mid section of the wafer. The radial gradient in particular leads to harmful stresses.

The aim of the present invention is further to restrict or completely to preclude the slip in a wafer during transport into and out of the thermal treatment chamber and in particular during the contact-free treatment.

Figure 12:
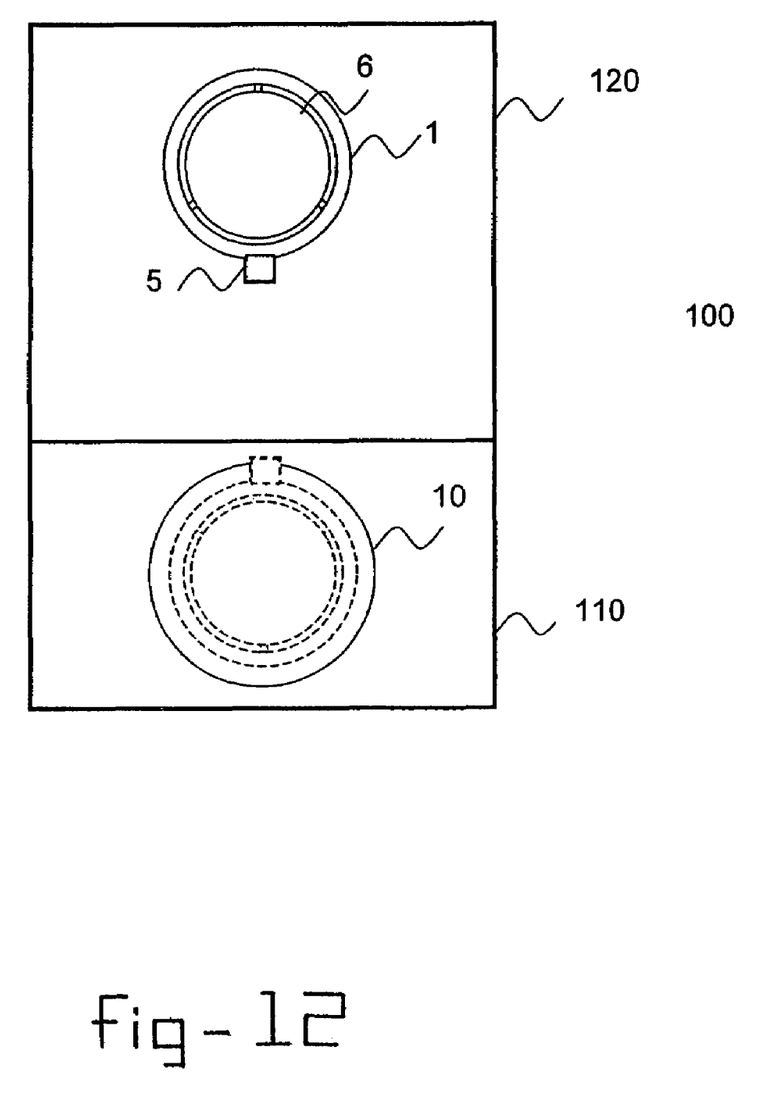
FIG. 12 shows a plan view of a thermal treatment installation, according to preferred embodiments of the invention.

An aspect of the present invention involves a method of transferring wafers into and out of a thermal treatment chamber in a thermal treatment installation. The treatment chamber has a top section and a bottom section between which the wafer is accommodated during treatment. As illustrated in FIG. 12, the thermal treatment installation 100 has a loading chamber 120 in which one wafer 6 of a set of wafers is combined with a ring 1 in a wafer/ring combination. The loading chamber 120 has loading means for placing the wafer 6 on a wafer support 1 and transport means for moving the wafer/ring combination. The wafer 6 is placed on the wafer support 1 with the loading means while in the loading chamber 120, wherein the wafer support 1 is configured as a ring having support elements to support the wafer 6. The wafer support 1 loaded with the wafer 6 is inserted into the thermal treatment chamber 110 of the reactor 10 using the transport means so that the wafer 6 and the wafer support 1 are positioned between the top section and the bottom section in the thermal treatment chamber 110. The wafer 6 is individually processed in the thermal treatment chamber 110. After processing the wafer 6, the wafer support 1 is removed from the thermal treatment chamber 110.

It is pointed out that arranging a ring around a wafer in order to restrict the temperature gradient over the wafer is known per se. The so-called "rapid thermal processing system" with which a wafer is heated very rapidly with the aid of lamps is described in U.S. Pat. No. 4,468,259. With this system the wafer is mechanically supported and the radial temperature gradient in particular leads to slip because of heat loss at the edge of the wafer. This slip is appreciably reduced by arranging a ring which absorbs thermal radiation around the wafer holder with a diameter somewhat larger than the diameter of the wafer. However, this ring is not used for transport of the wafer into and out of the reactor, so that the abovementioned stresses still arise during loading/unloading. This also applies in the case of the ring arranged around a wafer as described in U.S. Pat. No. 5,334,257. Here again the thermal capacity of the edge region of the wafer is increased and the edge will heat up less rapidly and a less pronounced radial temperature gradient will thus be produced over the wafer.

In U.S. Pat. No. 4,468,259 the ring is located in a fixed position in the thermal treatment chamber. In U.S. Pat. No. 5,334,257 the rings are arranged in a wafer rack and the rings serve only as transport means when transporting all wafers simultaneously.

The rings according to the invention can, of course, be handled by any robot known from the prior art.

The invention also relates to a thermal treatment installation/ring combination, wherein said thermal treatment installation comprises a treatment chamber delimited by two sections located opposite one another, wherein at least one of said sections is provided with a gas supply for floating positioning of a wafer between said sections, wherein said ring is designed to be placed between said sections, wherein in the operating position the distance between said two sections at the location of said ring essentially corresponds to the thickness of said ring and wherein at least three radial gas passages are arranged between said ring and the section concerned. Using such a combination of thermal treatment installation and ring it is possible accurately to determine the horizontal position of a wafer in a floating wafer reactor. In general, when positioning the wafer horizontally a gas stream will move towards the wafer both from the bottom and from the top of the reactor chamber in order to position said wafer accurately between the top section and bottom section of the reactor. For positioning in the horizontal plane a ring which is provided with outflow openings for said gas can be arranged around the wafer. It has been found that if the wafer moves towards a particular edge of the ring the outflow opening located in that position will be closed off to some extent, as a result of which a rise in the pressure of the gas occurs between the ring and the related edge, as a result of which the ring is pushed back towards the centre again. This is promoted in that the other openings allow more gas through, as a result of which a lowering in pressure occurs at these locations. In this way, particularly stable positioning is obtained and it is possible to work with a very small width of the gap between wafer and ring, for example approximately 0.2 mm. As a result of the use of such a ring the construction of the reactor walls, that is to say the top section and bottom section, can be appreciably simplified and can be made essentially flat. The passage through which the gas flows between the ring and the wall of the reactor can be made either in the wall of said reactor or in the top or bottom of the ring or in both. Lateral positioning of the wafer in the reactor is provided with the aid of the constructions according to the invention.

During introduction and removal of the wafer/ring combination the wafer can bear on support points on the ring. However, it is also possible to provide a separate auxiliary element equipped with support pins which extend through grooves or openings made in the reactor walls or in the top or bottom of the ring as described above, the ring and the wafer bearing on said support pins during movement. In a preferred variant said auxiliary element is likewise annular.

In a further preferred embodiment of this variant the support pins are provided with internal channels which at one end open onto the contact surface with the wafer and at the other end are in communication with an internal channel in the auxiliary ring, which channel is connected to vacuum means in order to produce a vacuum in the channels. As a result of the vacuum the wafer is pressed against the contact surface of the support pins with a greater force than just by the force of gravity exerted on the wafer and the wafer will shift less rapidly in the horizontal plane during acceleration or retardation.

The invention also relates to a thermal wafer treatment installation/ring combination comprising a thermal wafer treatment installation having at least one receptacle for wafers, wherein said receptacle is constructed to receive a ring in such a way that the ring is removable and wherein each ring is designed to accommodate and support a wafer therein.

BRIEF DESCRIPTION OF THE DRAWINGS

The invention will be explained in more detail below with reference to illustrative embodiments shown in the drawing. In the drawing.

DETAILED DESCRIPTION OF THE DRAWINGS

Figures 1, 2:
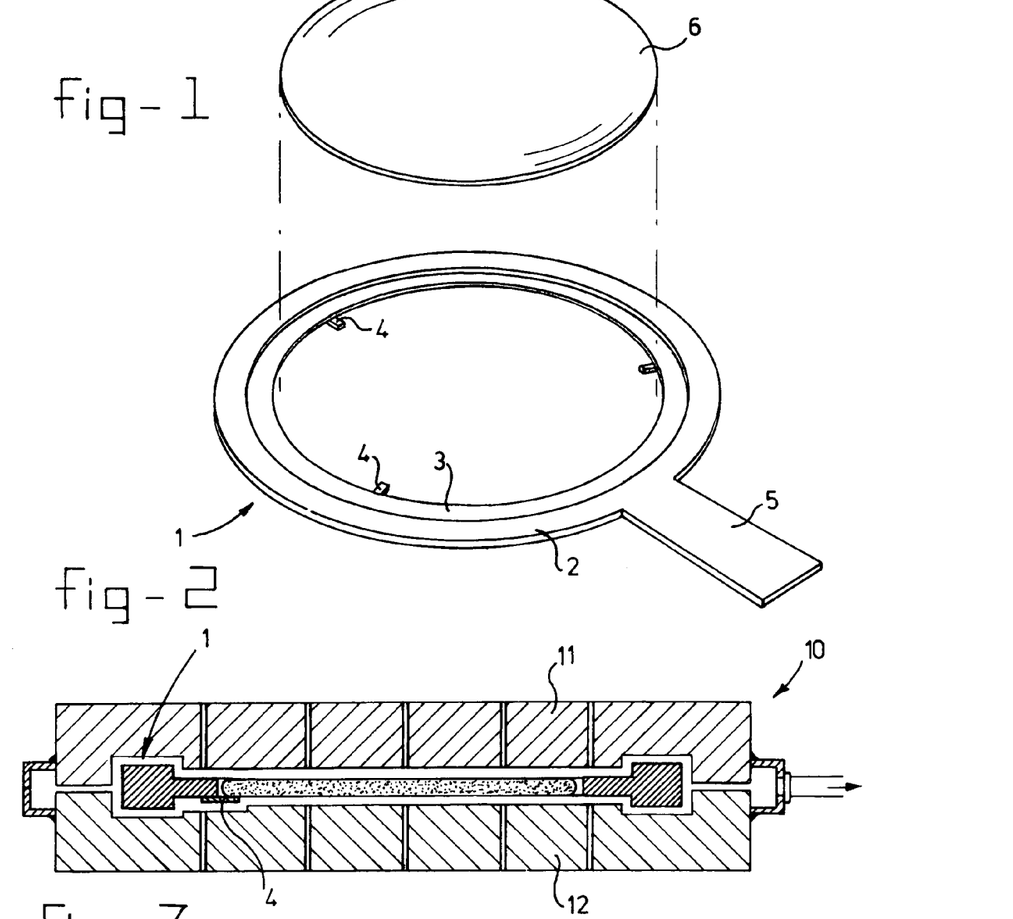
FIG. 1 shows a perspective view of a first embodiment of the ring according to the invention with a wafer removed therefrom.
FIG. 2 shows, diagrammatically, in cross-section, the ring according to FIG. 1 with wafer during introduction into a reactor.

A first embodiment of the ring according to the invention is shown in perspective in FIG. 1 and is indicated in its entirety by 1. This ring consists of a somewhat thicker outer edge 2 and a thinner inner edge 3. Three support pins 4 are provided. The ring 2 is provided with a handling portion 5 for fixing to some sort of handling robot. A wafer is indicated by 6. The external diameter of the wafer 6 is somewhat smaller than the internal diameter of inner edge 3, such that the wafer 6 bears on the support points 4 during transport thereof. Ring 1 is intended for such transport, as can be seen from FIG. 2. This figure shows the introduction of the wafer 6 into a reactor 10 consisting of a top section 11 and a bottom section 12 which are heated in some manner known from the prior art. During introduction the wafer bears on the support pins 4.

Figure 3:
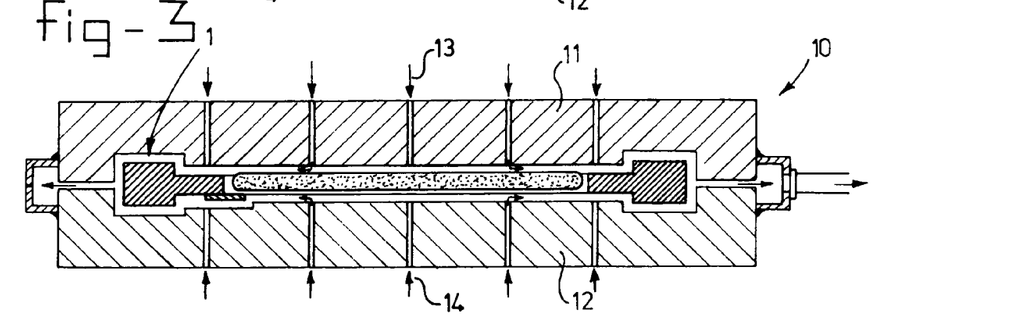
FIG. 3 shows, diagrammatically, the ring with wafer according to FIG. 2 during the treatment in the reactor.

After the wafer has been introduced into the reactor 10 and the reactor is closed in some way, gas streams 13 and 14 are activated, as a result of which the wafer conies away from the support pins 4 and starts to float and can be treated (FIG. 3). After treatment the gas streams 13 and 14 are switched off and the wafer returns to the support pins 4 and is removed from the reactor. During introduction and removal the high heat gradient which is produced over the wafer is essentially compensated for by the presence of the ring 1. After all, as a result of the relatively high thermal capacity of the ring, more rapid cooling at the edge of the wafer than in the centre thereof will be prevented. The cooling characteristics or heating characteristics of the wafer during transport can be controlled by the selection of the material and control of the wall thickness of the ring and the distance between the edge of the wafer and inner edge 3.

It must be understood that it is not necessary to allow the wafer to rest on the support points during transport. In principle it is also possible to provide an arrangement by means of which the wafer is in the floating state during transport. By this means it is guaranteed that there is no critical temperature transition at the support points.

Figure 4A:
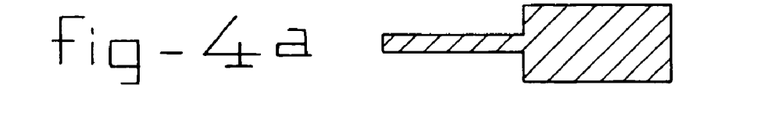
FIGS. 4*a–c* show, in cross-section, various variants of the ring according to the invention.
Figure 4B:
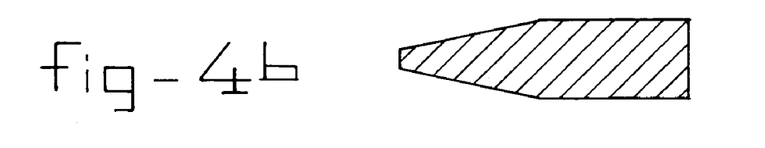
Figure 4C:
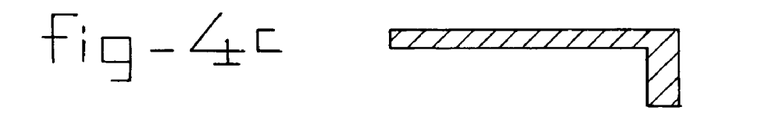

As described above, the outer edge 2 of the ring 1 is made somewhat thicker. By this means mechanical strength is provided and the thermal capacity increases. The differences between inner edge 2 and outer edge 3 can comprise any construction conceivable in the state of the art. A few examples are given in FIGS. 4a–c.

Figure 5A:
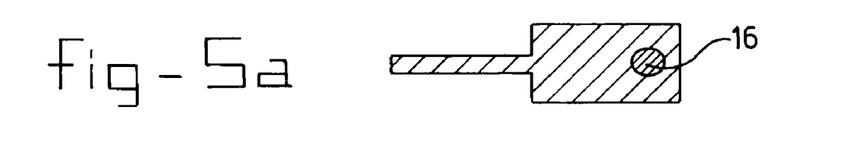
FIGS. 5*a,b* show further variants provided with heating means.
Figure 5B:
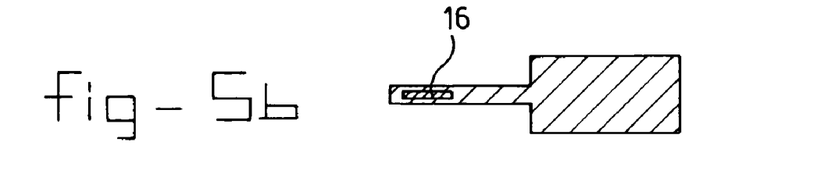

Moreover, it is possible to supply heat from the ring during transport of the wafer. For this purpose heating elements 16 can be fitted, as is shown in FIG. 5. In the case of FIG. 5a the material of the ring will consist of a material that transmits radiation, such as quartz material. Consequently the distance from the heating element 16 to the inner ring 3 does not constitute a problem. In the embodiment according to FIG. 5b the characteristics of the ring in respect of the transmission of radiation are less important because the heating element is closer to the wafer.

Figure 6:
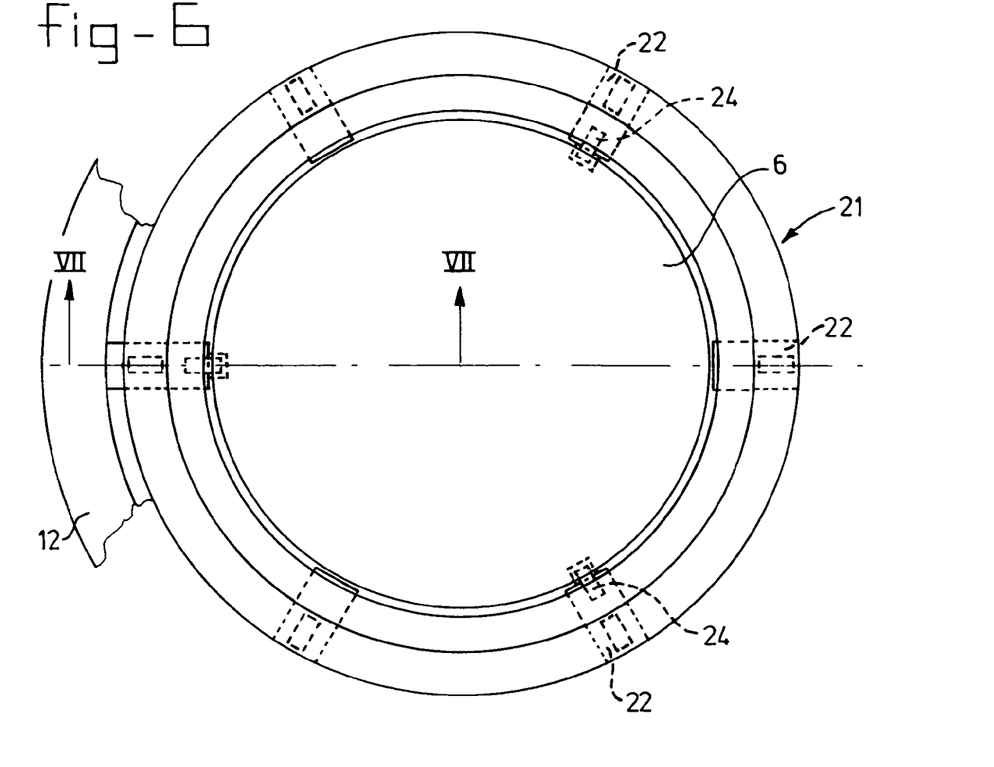
FIG. 6 shows a plan view of a further embodiment of the ring according to the invention.
Figure 7:
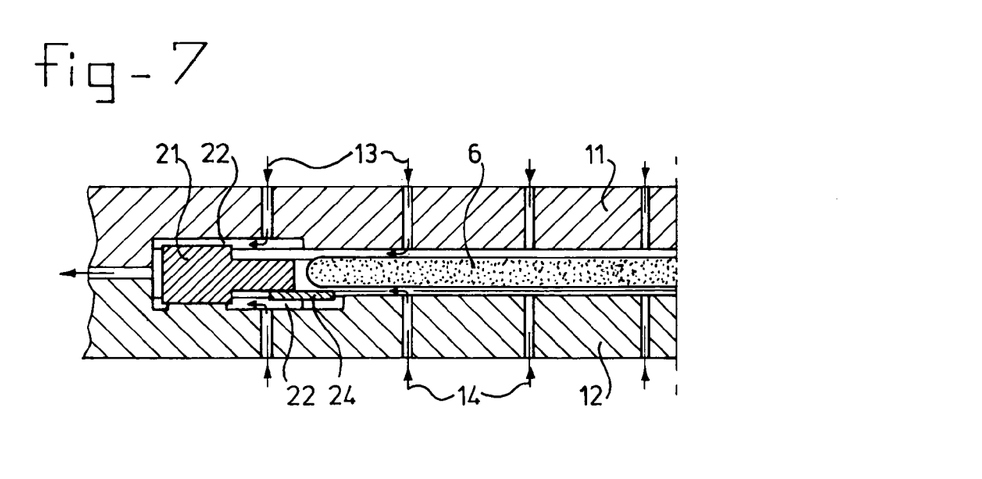
FIG. 7 shows a side view of the ring with wafer according to FIG. 6.

FIG. 6 shows a plan view of a further variant of the ring according to the invention. This ring is indicated in its entirety by 21. The support pins are indicated by 24. In contrast to the rings described above, radial gas passages are present, which are indicated by 22. In this case these passages are grooves. FIG. 7 shows the various features in cross-section during operation. It can be seen that gas stream 14 which holds the wafer in the middle between the top section 11 and the bottom section 12 is deflected and moves away in the radial direction over the wafer. However, the gases are only able to escape from the environment of the wafer through the grooves 22. As a result of using the ring the x-y position of the wafer is accurately determined. After all, if the wafer 6 moves towards one of the grooves 22 the somewhat obstructing effect of the wafer will mean that less gas can be discharged at that location. As a result the pressure rises at that location and the wafer will move back.

Figure 8:
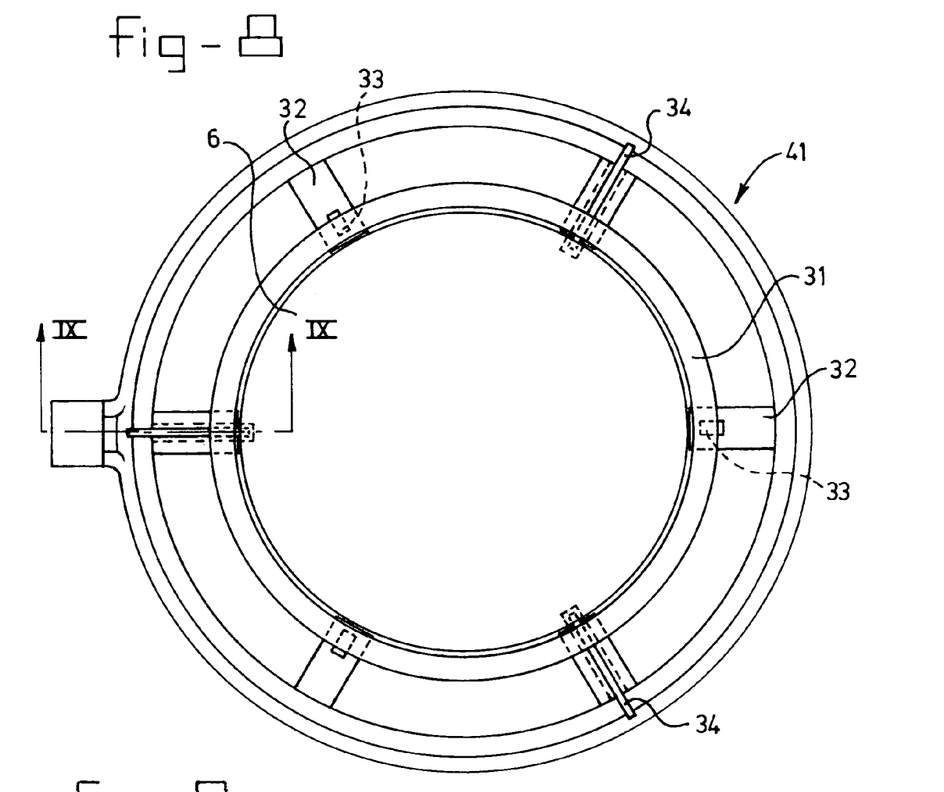
FIG. 8 shows a variant of FIGS. 6 and 7 with auxiliary ring.
Figure 9:
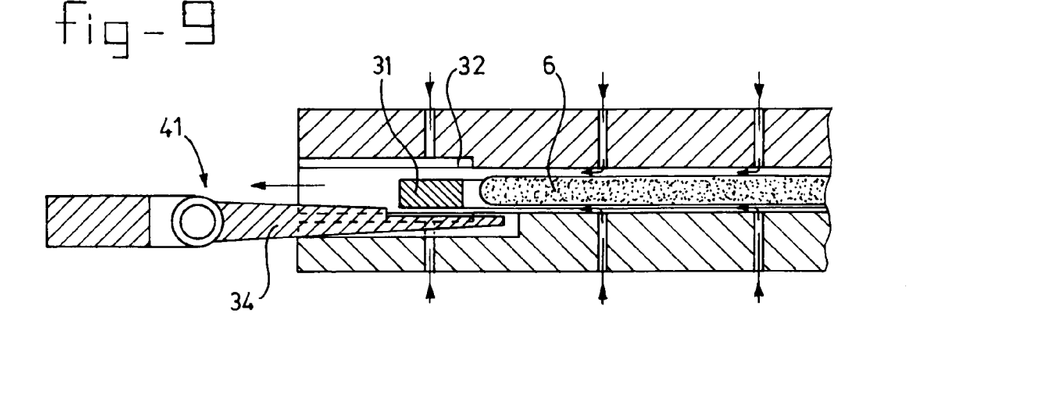
FIG. 9 shows a side view of a construction according to FIG. 8 introduced into a reactor.

A variant is shown in FIG. 8, the ring 31 shown in this figure not being provided with support points. A further ring 41 is arranged around ring 31 and this ring is provided with support pins 34 which extend through the gas discharge grooves 32 which have been made in the bottom section 12 of the reactor. FIG. 9 shows a cross-section of this variant, introduced into a reactor.

Figure 10:
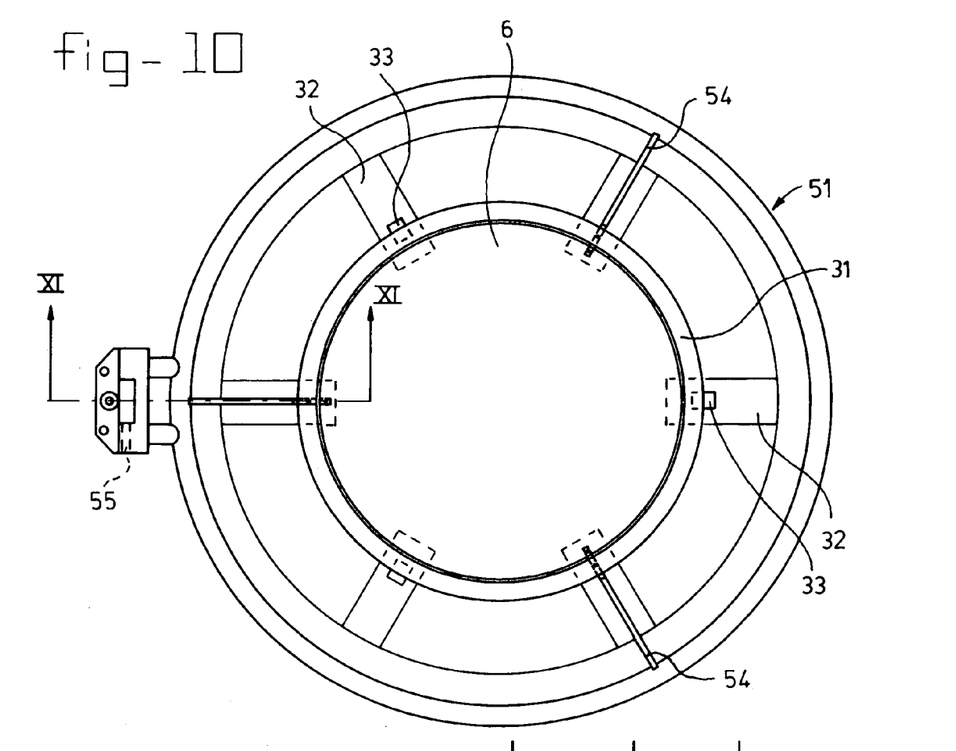
FIG. 10 shows a variant of FIGS. 6 and 7 with auxiliary ring.
Figure 11:
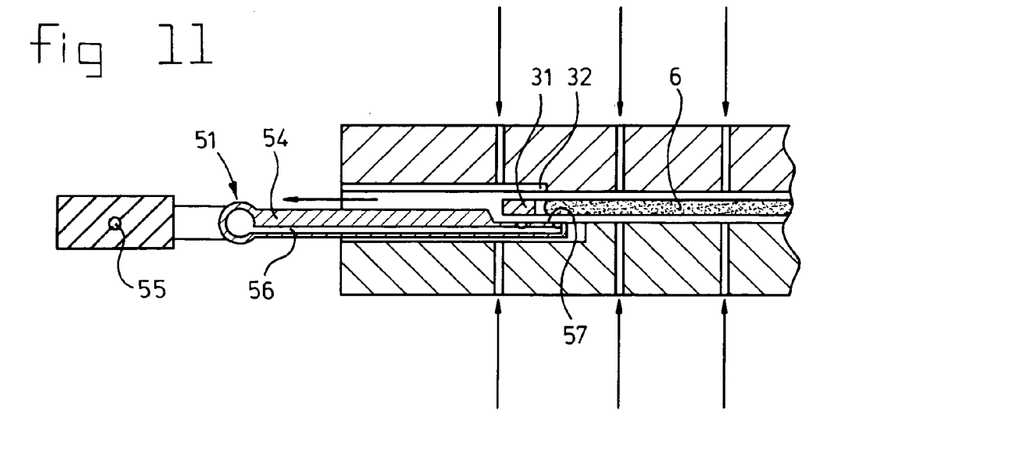
FIG. 11 shows a side view of a construction according to FIG. 8 introduced into a reactor.

A variant is shown in FIG. 10, the ring 31 in this figure not being provided with support points. A further ring 51 is arranged around ring 31 and this ring is provided with support pins 54 which extend through the gas discharge grooves 32 which have been made in the bottom section 12 of the reactor. The support pins 54 are provided with internal channels 56 which at one end open onto the contact surface 57 with the wafer and at the other end are in communication with an internal channel in the auxiliary ring 51, which is connected via communication passage 55 to vacuum means (not shown) in order to produce a vacuum in the channels. As a result of the vacuum the wafer is pressed against the contact surface of the support pins with a greater force than just by the force of gravity which is exerted on the wafer and the wafer will shift less rapidly in the horizontal plane on acceleration or retardation. FIG. 11 shows a cross-section of this variant, introduced into a reactor.

Using the construction described in FIGS. 6–9, the top and bottom section of the reactor, that is to say sections 11 and 12, can be produced in a particularly simple manner. In this embodiment radial positioning is achieved with the aid of the ring 21, 31. With this arrangement the boundary surface of the top section 11 and bottom section 12 with the reactor chamber can be essentially flat, a few grooves having been milled therein.

Those skilled in the art will understand from the large number of variants that have been described above that further developments are possible without going beyond the scope of the present invention as described in the appended claims.

What is claimed is:

1. A thermal treatment installation/ring combination comprising a loading chamber, loading means, transport means and a thermal treatment chamber for carrying out a thermal treatment, said thermal treatment chamber comprising a top section and a bottom section located opposite to each other and between which a wafer can be accommodated for carrying out a thermal treatment, said transport means being equipped to move wafer/ring combinations from the loading chamber into the thermal treatment chamber and vice versa, wherein said thermal treatment chamber is configured to carry out a thermal treatment on one wafer at a time, said transport means being equipped to move individual wafer/ring combinations from the loading chamber and insert said individual wafer/ring combination into the thermal treatment chamber and vice versa, wherein the thermal treatment chamber is configured to accommodate said ring surrounding the wafer and to hold the wafer contact-free in a floating state during the treatment, wherein a separation between said top and bottom sections at a location of the ring during the thermal treatment essentially corresponds to a thickness of said ring.

2. The thermal treatment/ring combination of claim 1, wherein said top section and bottom section are provided with heating means.

3. The thermal treatment installation/ring combination of claim 1, wherein an internal diameter of an inner edge of the ring is larger than an external diameter of the wafer.

4. The thermal treatment installation/ring combination of claim 1, wherein the ring is configured to support said wafer at least during transfer.

5. The thermal treatment installation/ring combination of claim 4, wherein the ring is mechanically joined to the transport means.

6. The thermal treatment installation/ring combination of claim 4, wherein the treatment chamber is configured to accommodate an auxiliary element for supporting the ring and the wafer at least during transfer.

7. The thermal treatment installation/ring combination of claim 6, wherein said auxiliary element is mechanically joined to the transport means.

8. The thermal treatment installation/ring combination of claim 6, wherein said ring is provided with heating means wherein the heating means are provided with the ring.

9. A thermal treatment installation/ring combination comprising a loading chamber, wherein a wafer and a ring are combined to form a wafer/ring combination, and a thermal treatment chamber for carrying out a thermal treatment, said thermal treatment chamber comprising a top section and a bottom section located opposite to each other and between which the wafer can be accommodated for carrying out a thermal treatment, wherein said thermal treatment chamber is configured to carry out a thermal treatment on one wafer at a time, wherein the thermal treatment chamber is configured to accommodate said ring surrounding the wafer with a distance between said top and bottom sections at a location of the ring during the thermal treatment essentially corresponding to a thickness of said ring and where in the ring is configured to surround the wafer within the thermal treatment chamber and within the loading chamber, wherein said installation/ring combination is configured and operable to move the wafer/ring combination from the loading chamber into the thermal treatment chamber and vice versa.

\* \* \* \* \*

UNITED STATES PATENT AND TRADEMARK OFFICE
CERTIFICATE OF CORRECTION

PATENT NO. : 7,048,488 B1
APPLICATION NO. : 10/009851
DATED : May 23, 2006
INVENTOR(S) : Kuznetsov et al.

It is certified that error appears in the above-identified patent and that said Letters Patent is hereby corrected as shown below:

On the title page item (56), Page 2; Column 2 (Foreign Patent Documents); Line 3; After "JP 63-136532" delete "8/1968" and insert --8/1988--, therefor.

Column 5; Line 23; Delete "conies" and insert -- comes --, therfor.

Column 6; Line 48; In Claim 1, after "chamber," delete "loading means,".

Column 7; Line 22; In Claim 8, delete "with" and insert --within--, therefor.

Column 8, Line 15 (Approx.); In Claim 9, delete "where in" and insert --wherein--, therefor.

Signed and Sealed this

Twenty-first Day of November, 2006

JON W. DUDAS
*Director of the United States Patent and Trademark Office*